US010062752B1

(12) United States Patent
Leobandung (10) Patent No.: US 10,062,752 B1
(45) Date of Patent: Aug. 28, 2018

(54) FABRICATION OF NANOWIRE VERTICAL GATE DEVICES

(71) Applicant: INTERNATIONAL BUSINESS MACHINES CORPORATION, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/793,566

(22) Filed: Oct. 25, 2017

(51) Int. Cl.
*H01L 29/06* (2006.01)
*H01L 29/20* (2006.01)
*H01L 29/66* (2006.01)
*H01L 21/18* (2006.01)
*H01L 29/778* (2006.01)

(52) U.S. Cl.
CPC ........ *H01L 29/0669* (2013.01); *H01L 21/182* (2013.01); *H01L 29/2003* (2013.01); *H01L 29/66462* (2013.01); *H01L 29/66666* (2013.01); *H01L 29/7786* (2013.01); *H01L 29/7788* (2013.01)

(58) Field of Classification Search
CPC ............. H01L 29/0669; H01L 21/182; H01L 29/2003; H01L 29/66462; H01L 29/66666; H01L 29/7786; H01L 29/7788
See application file for complete search history.

(56) References Cited

U.S. PATENT DOCUMENTS

| 5,504,359 | A | 4/1996 | Rodder |
| 6,156,611 | A | 12/2000 | Lan et al. |
| 6,518,622 | B1 | 2/2003 | Chew et al. |
| 6,773,994 | B2 | 8/2004 | Chittipeddi et al. |
| 7,033,877 | B2 | 4/2006 | Chaudhry et al. |
| 9,171,925 | B2 | 10/2015 | Kuo et al. |
| 9,627,531 | B1 | 4/2017 | Chiang et al. |
| 2009/0309630 | A1* | 12/2009 | Ito ...................... H03K 19/0002 326/60 |
| 2013/0270508 | A1* | 10/2013 | Li ....................... H01L 45/1206 257/4 |

(Continued)

OTHER PUBLICATIONS

Leobandung et al., "Stacked Vertical Devices," U.S. Appl. No. 15/466,168, filed Mar. 22, 2017. pp. 1-58.

(Continued)

*Primary Examiner* — Karen Kusumakar
(74) *Attorney, Agent, or Firm* — Tutunjian & Bitetto, P.C.; Vazken Alexanian (57) ABSTRACT

A method of forming a nanowire heterostructure, including, forming a dummy nanowire on a substrate, forming a sacrificial cover layer on the dummy nanowire, forming a spacer layer on a portion of the sacrificial cover layer, wherein a portion of the sacrificial cover layer extends above the top surface of the spacer layer, removing the portion of the sacrificial cover layer that extends above the top surface of the spacer layer, forming a gate structure on the spacer layer and a remaining portion of the sacrificial cover layer, forming an interlayer dielectric (ILD) layer on the gate structure, removing the dummy nanowire to form a nanowire trench, and forming a replacement nanowire in the nanowire trench.

20 Claims, 10 Drawing Sheets

(56) References Cited

U.S. PATENT DOCUMENTS

2015/0076596 A1* 3/2015 Colinge ............ H01L 29/66356
                                                257/335
2016/0071968 A1   3/2016 Leobandung et al.
2017/0309630 A1* 10/2017 Cheng ................. H01L 27/0924

OTHER PUBLICATIONS

Hergenrother et al., "The Vertical Replacement-Gate (VRG) MOSFET: A 50-nm Vertical MOSFET with Lithography-Independent Gate Length," International Electron Devices Meeting, Dec. 5-8, 1999. pp. 75-78.

* cited by examiner

FABRICATION OF NANOWIRE VERTICAL GATE DEVICES

BACKGROUND

Technical Field

The present invention generally relates to nanowire vertical gate devices, and more particularly to replacement of a silicon pillar with a III-V semiconductor nanowire to form a vertical gate transistor.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method of forming a nanowire heterostructure is provided. The method includes forming a dummy nanowire on a substrate, and forming a sacrificial cover layer on the dummy nanowire. The method further includes forming a spacer layer on a portion of the sacrificial cover layer, wherein a portion of the sacrificial cover layer extends above the top surface of the spacer layer, and removing the portion of the sacrificial cover layer that extends above the top surface of the spacer layer. The method further includes forming a gate structure on the spacer layer and a remaining portion of the sacrificial cover layer. The method further includes forming an interlayer dielectric (ILD) layer on the gate structure. The method further includes removing the dummy nanowire to form a nanowire trench, and forming a replacement nanowire in the nanowire trench.

In accordance with another embodiment of the present invention, a method of forming a nanowire heterostructure is provided. The method includes forming a dummy nanowire on a substrate, and forming a sacrificial cover layer on the dummy nanowire. The method further includes forming a spacer layer on a portion of the sacrificial cover layer, wherein a portion of the sacrificial cover layer extends above the top surface of the spacer layer, and removing the portion of the sacrificial cover layer that extends above the top surface of the spacer layer. The method further includes forming a gate structure on the spacer layer and a remaining portion of the sacrificial cover layer. The method further includes forming a dummy source/drain spacer on the dummy nanowire. The method further includes forming an interlayer dielectric (ILD) layer on the gate structure and dummy source/drain spacer. The method further includes removing the dummy nanowire to form a nanowire trench, and forming a replacement nanowire in the nanowire trench. The method further includes forming an access channel through the ILD layer and the spacer layer to the remaining portion of the sacrificial cover layer.

In accordance with another embodiment of the present invention, a vertical transport field effect transistor is provided. The vertical transport field effect transistor includes a replacement nanowire on a substrate, wherein the replacement nanowire is a III-V semiconductor material. The vertical transport field effect transistor further includes a bottom source/drain region on the replacement nanowire and the substrate, and a boron nitride (BN) spacer layer on a portion of the bottom source/drain region. The vertical transport field effect transistor further includes a gate structure on the boron nitride (BN) spacer layer and the bottom source/drain region. The vertical transport field effect transistor further includes an interlayer dielectric (ILD) layer on the gate structure, and a top source/drain region on the interlayer dielectric (ILD) layer and the replacement nanowire.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to vertical devices having channel regions formed of III-V semiconductor materials, where the III-V nanowires are formed after higher temperature processes, for example, gate structure formation.

Embodiments of the present invention relate to substitution of dummy nanowires with replacement III-V semiconductor nanowires to form a nanowire heterostructure, and the formation of top and bottom source/drains through substitution of sacrificial layers and dummy spacers with semiconductor source/drain material. Uniform removal of material surrounding upper and lower portions of the replacement nanowires can form void spaces above and below gate structures that can be filled with source/drain material adjoining the replacement nanowires.

Embodiments of the present invention relate to formation of nanowires of III-V semiconductor material having a lattice mismatch with the underlying growth surface to achieve a heterostructure device channel, where there is a compositional change at the substrate-nanowire interface. Replacement nanowires can be binary or ternary III-V semiconductor material on a IV (e.g., Si) or IV-IV (e.g., SiGe or SiC) substrate surface. The substrate may be selected to reduce lattice mismatch between the III-V nanowire material and substrate material.

Embodiments of the present invention relate to formation of heterostructure nanowires of III-V semiconductor material having a height in the range of about 200 nm to about 500 nm without introduction of dislocations (e.g., threading dislocations) at the substrate-nanowire interface due to lattice mismatch.

Exemplary applications/uses to which the present invention can be applied include, but are not limited to: vertical transport field effect transistors, logic devices, memory devices, and low leakage current devices.

It is to be understood that aspects of the present invention will be described in terms of a given illustrative architecture; however, other architectures, structures, substrate materials and process features and steps can be varied within the scope of aspects of the present invention.

Figure 1:
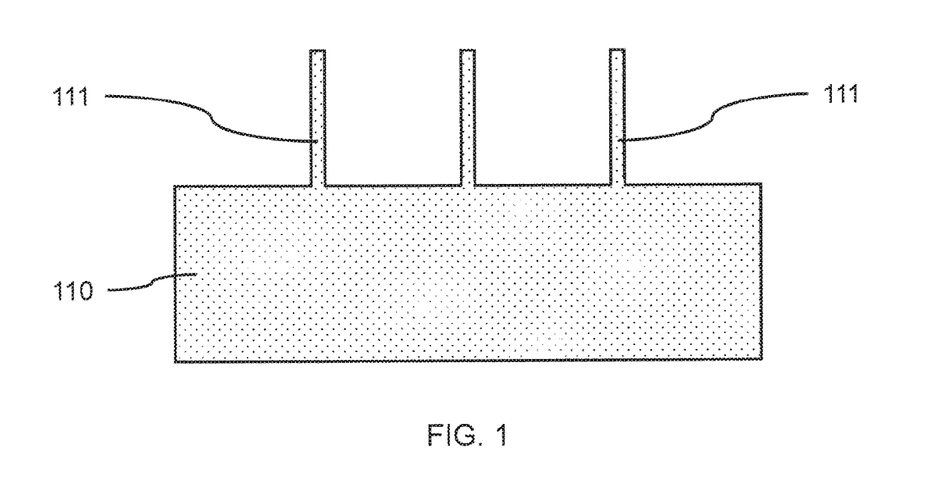
FIG. 1 is a cross-sectional side view showing a plurality of vertical dummy nanowires formed on a substrate, in accordance with an embodiment of the present invention.

Referring now to the drawings in which like numerals represent the same or similar elements and initially to FIG. 1, a cross-sectional side view of a plurality of vertical dummy nanowires formed on a substrate is shown, in accordance with an embodiment of the present invention.

In one or more embodiments, a plurality of vertical dummy nanowires 111 can be formed on a substrate 110, wherein the vertical dummy nanowires extend away from an exposed surface of the substrate. The vertical dummy nanowires 111 and substrate 110 can be formed from a semiconductor material, where the vertical dummy nanowires can be the same material as the substrate or a different semiconductor material from the substrate. The vertical dummy nanowires 111 can be etched or grown.

In one or more embodiments, a plurality of vertical dummy nanowires 111 can be formed on the substrate 110, where the vertical dummy nanowires 111 can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical dummy nanowires 111 may be formed by a direct write process or double patterning process using, for example, immersion lithography, extreme ultraviolet lithography, or x-ray lithography.

A substrate 110 can be, for example, a single crystal, semiconductor material, wafer or a semiconductor-on-insulator stacked wafer. The substrate 110 can include a support layer that provides structural support, and an active semiconductor layer that can form devices. An insulating layer may be between the active semiconductor layer and the support layer to form a semiconductor-on-insulator substrate (SeOI) (e.g., a silicon-on-insulator substrate (SOI)).

The support layer can include crystalline, semi-crystalline, micro-crystalline, nano-crystalline, and/or amorphous phases. The support layer can be a semiconductor (e.g., silicon (Si), silicon carbide (SiC), silicon-germanium (SiGe), germanium (Ge), gallium-arsenide (GaAs), cadmium-telluride (CdTe), etc.), an insulator (e.g.: glass (e.g. silica, borosilicate glass), ceramic (e.g., aluminum oxide ($Al_2O_3$, sapphire), plastic (e.g., polycarbonate, polyacetonitrile), metal (e.g. aluminum, gold, titanium, molybdenum-copper (MoCu) composites, etc.), or combination thereof.

The active semiconductor layer can be a crystalline semiconductor, for example, a IV or IV-IV semiconductor (e.g., silicon (Si), silicon carbide (SiC), silicon-germanium (SiGe), germanium (Ge)), a III-V semiconductor (e.g., gallium-arsenide (GaAs), indium-phosphide (InP), indium-antimonide (InSb)), a II-VI semiconductor (e.g., cadmium-telluride (CdTe), zinc-telluride (ZnTe), zinc sulfide (ZnS), zinc selenide (ZnSe)), or a IV-VI semiconductor (e.g., tin sulfide (SnS), lead selenide (PbSb)).

The insulating layer can be, for example, a buried oxide (BOX) layer (e.g., $SiO_2$) or an implanted layer forming a buried insulating material.

The substrate 110 may include dopants to form a punch-through stop layer.

Figure 2:
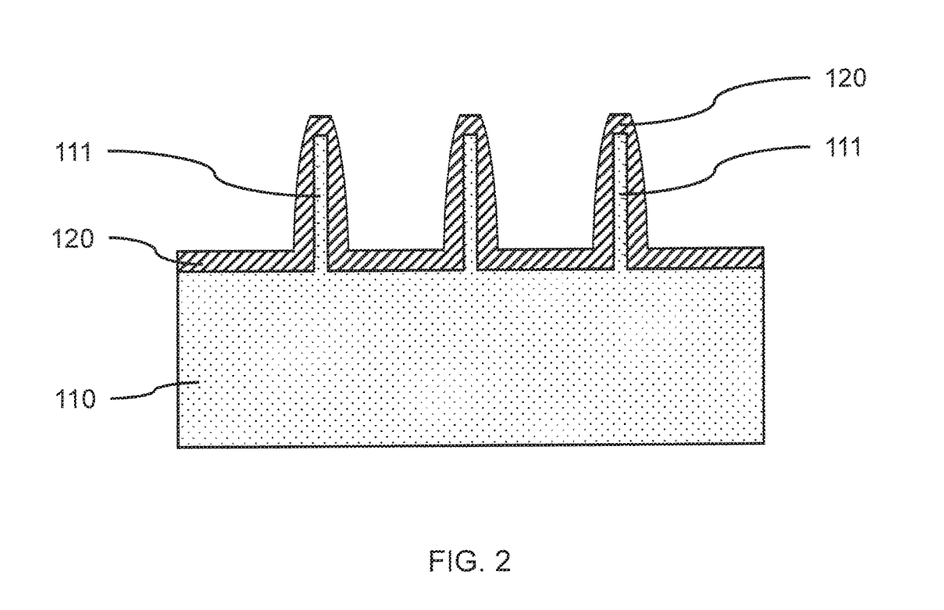
FIG. 2 is a cross-sectional side view showing a sacrificial cover layer on the plurality of vertical dummy nanowires and top surface of the substrate, in accordance with an embodiment of the present invention.

FIG. 2 is a cross-sectional side view showing a sacrificial cover layer on the plurality of vertical dummy nanowires and top surface of the substrate, in accordance with an embodiment of the present invention.

In one or more embodiments, a sacrificial cover layer 120 can be formed on the plurality of vertical dummy nanowires and top surface of the substrate, where the sacrificial cover layer 120 can be formed by a blanket deposition, for example, chemical vapor deposition (CVD), plasma enhanced CVD (PECVD), or a combination thereof.

In one or more embodiments, the sacrificial cover layer 120 can be formed on only a portion of the substrate 110 surrounding one or more vertical dummy nanowires 111. The sacrificial cover layer 120 can be formed on only a portion of the substrate 110, so removal of the sacrificial cover layer 120 does not cause layers and features formed on the sacrificial cover layer 120 to collapse when the sacrificial cover layer 120 is removed. Overlying layers and features can be cantilevered and/or supported through contact with other remaining layers and device features.

In one or more embodiments, the sacrificial cover layer 120 can be formed of a dielectric insulating material that can be selectively etched relative to the surrounding materials. The sacrificial cover layer 120 can be, for example, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), boron carbide (BC), boron nitride (BN), or combinations thereof.

In one or more embodiments, the sacrificial cover layer 120 can have a thickness in the range of about 10 nm to about 50 nm, or in the range of about 15 nm to about 35 nm, where the sacrificial cover layer 120 covers the exposed surface of the substrate 110, and sidewalls and top surfaces of the vertical dummy nanowires 111 on which it is formed.

Figure 3:
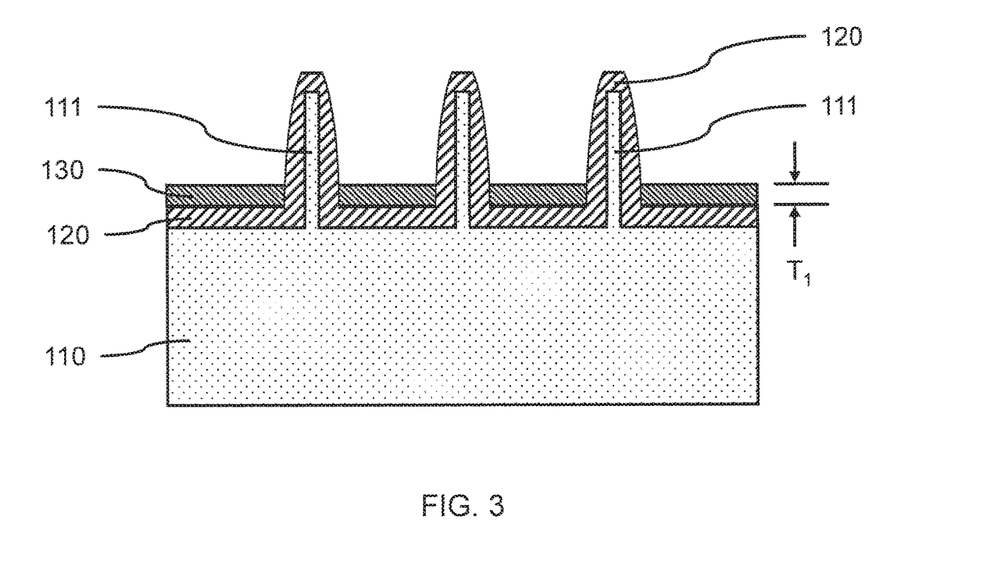
FIG. 3 is a cross-sectional side view showing a spacer layer on portions of the sacrificial cover layer, in accordance with an embodiment of the present invention.

FIG. 3 is a cross-sectional side view showing a spacer layer on portions of the sacrificial cover layer, in accordance with an embodiment of the present invention.

In one or more embodiments, a spacer layer 130 can be formed on the sacrificial cover layer 120. The spacer layer 130 can be formed by a blanket deposition and etch-back process or a directional deposition (e.g., gas cluster ion beam (GCIB), high density plasma (HDP)). In various embodiments, the spacer layer 130 can be formed by a subtractive method, where the spacer layer 130 is formed over the top surfaces of the vertical dummy nanowires 111, and the height of the spacer layer reduced by a chemical-mechanical polishing (CMP) and etching to a predetermined thickness, $T_1$. In various embodiments, the spacer layer 130 can be formed by a high density plasma (HDP) deposition process, where the spacer layer 130 is directionally formed on the exposed, top surfaces of the sacrificial cover layer 120.

In various embodiments, the spacer layer 130 can be formed of a low-K insulating dielectric, for example, amorphous carbon (a-C), carbon doped silicon oxide (SiO:C), fluorine doped silicon oxide (SiO:F), boron nitride (BN), boron carbon nitride (BCN), silicon oxynitride (SiON), hydrogen silsesquioxane polymer (HSQ), methyl silsesquioxane polymer (MSQ), organosilicate glass (SiCOH), porous SiCOH, and combinations thereof.

In various embodiments, the spacer layer 130 and sacrificial cover layer 120 are made of different materials, so the sacrificial cover layer 120 can be selectively removed, for example, by a selective isotropic etch (e.g., wet chemical etch) relative to the spacer layer 130.

In one or more embodiments, the spacer layer 130 can have a thickness, $T_1$, in the range of about 10 nm to about 50 nm, or in the range of about 15 nm to about 35 nm.

Figure 4:
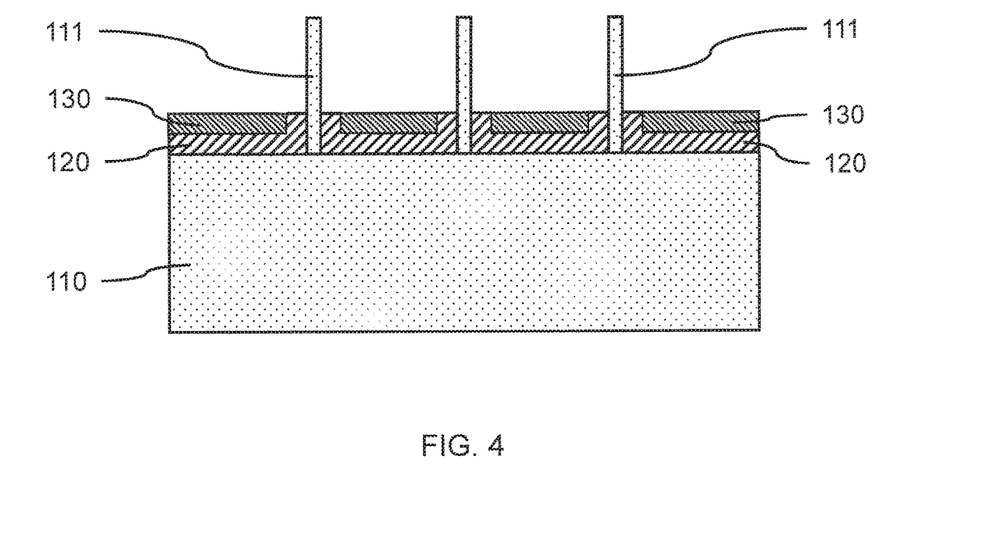
FIG. 4 is a cross-sectional side view showing an exposed upper portion of the vertical dummy nanowires after removal of the exposed portion of the sacrificial cover layer, in accordance with an embodiment of the present invention.

FIG. 4 is a cross-sectional side view showing an exposed upper portion of the vertical dummy nanowires after removal of the exposed portion of the sacrificial cover layer, in accordance with an embodiment of the present invention.

In one or more embodiments, an exposed upper portion of the sacrificial cover layer 120 can be removed to expose an upper portion of the vertical dummy nanowires 111, where the spacer layer 130 masks the lower portion of the sacrificial cover layer 120. The exposed upper portion of the sacrificial cover layer 120 can be removed using a selective, isotropic etch (e.g., wet chemical etch) that leaves a portion of the sacrificial cover layer 120 on a lower portion of the sidewalls of vertical dummy nanowires 111. The remaining portion of the sacrificial cover layer 120 can be L-shaped with the short leg of the 'L' in contact with the vertical dummy nanowire sidewall. The sacrificial cover layer 120 can cover about ¼ to about ⅖ of the height of the vertical dummy nanowires 111, or about ⅓ of the height of the vertical dummy nanowires 111.

Figure 5:
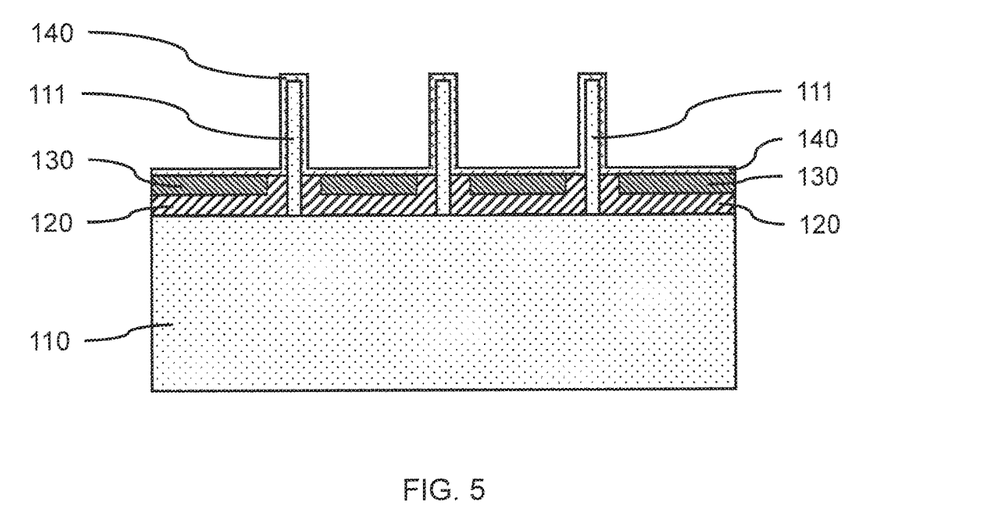
FIG. 5 is a cross-sectional side view showing a gate dielectric layer on the upper portion of the vertical dummy nanowires, in accordance with an embodiment of the present invention.

FIG. 5 is a cross-sectional side view showing a gate dielectric layer on the upper portion of the vertical dummy nanowires, in accordance with an embodiment of the present invention.

In one or more embodiments, a gate dielectric layer 140 can be formed on the exposed upper portion of the vertical dummy nanowires 111, where the gate dielectric layer 140 can be formed by a conformal deposition (e.g., atomic layer deposition (ALD) or plasma enhanced ALD (PEALD)).

In various embodiments, the gate dielectric layer 140 can have a thickness in the range of about 1 nm to about 5 nm, or about 2 nm to about 4 nm.

In one or more embodiments, a gate dielectric layer 140 can be silicon oxide (SiO), silicon nitride (SiN), silicon oxynitride (SiON), high-k dielectric materials, or a combination of these materials. Examples of high-k dielectric materials include, but are not limited to, metal oxides such as hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), and aluminum oxide (AlO). The high-k material can further include dopants such as lanthanum (La) and aluminum (Al).

Figure 6:
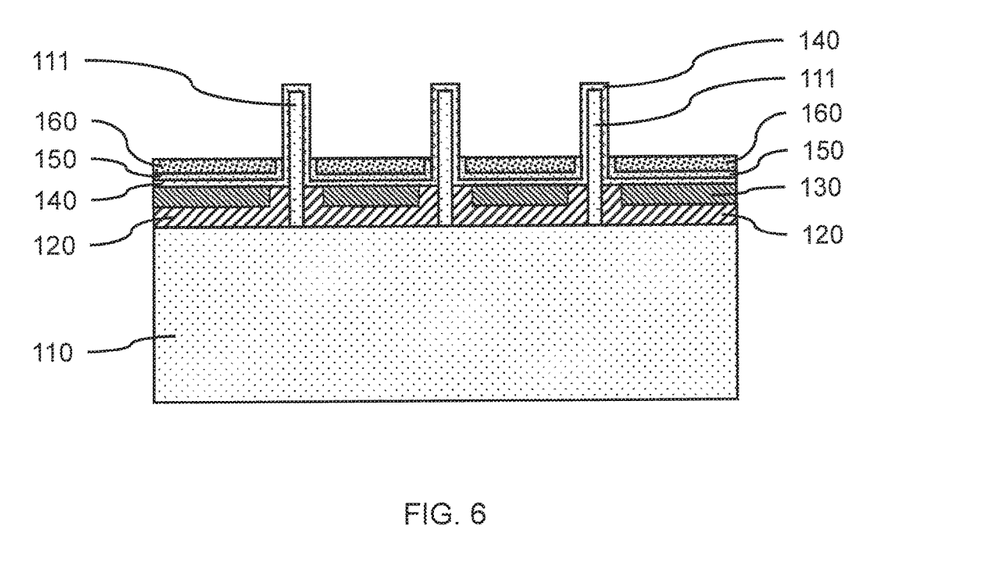
FIG. 6 is a cross-sectional side view showing a work function layer on a portion of the gate dielectric layer, and a gate fill layer on the work function layer, in accordance with an embodiment of the present invention.

FIG. 6 is a cross-sectional side view showing a work function layer on a portion of the gate dielectric layer, and a gate fill layer on the work function layer, in accordance with an embodiment of the present invention.

In one or more embodiments, a work function layer 150 can be formed on the gate dielectric layer 140, where the work function layer 150 can be formed by a conformal deposition (e.g., ALD, PEALD).

In various embodiments, the work function layer 150 can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

In various embodiments, the work function layer 150 can have a thickness in the range of about 2 nm to about 10 nm, or about 4 nm to about 7 nm.

In one or more embodiments, a gate fill layer 160 can be formed on the work function layer 150, where the gate fill layer 160 can be blanket deposited (e.g., CVD, PECVD, PVD, etc.). The gate fill layer 160 can be etched back and/or a CMP can be used to reduce the height of the gate fill layer 160 to the top surface of the work function layer 150.

In various embodiments, the height of the gate fill layer 160 can be reduced by a directional etch (e.g., reactive ion etch (RIE)) to a predetermined height that exposes an upper portion of the work function layer 150 on the vertical dummy nanowires 111. The exposed portion of the work function layer 150 can be removed using a selective isotropic etch to expose the upper portion of the gate dielectric layer 140 on the vertical dummy nanowires 111. The height of the gate fill layer 160 and work function layer 150 can define a gate length on the vertical dummy nanowires 111 and subsequently formed replacement nanowires.

In various embodiments, the gate fill layer 160 material can include doped polycrystalline silicon (p-Si) or amorphous silicon (a-Si), germanium (Ge), silicon-germanium (SiGe), a metal (e.g., tungsten, titanium, tantalum, ruthenium, zirconium, cobalt, copper, aluminum, lead, platinum, tin, silver, or gold), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), cobalt silicide (CoSi), nickel silicide (NiSi)), carbon nanotube(s) (CNTs), conductive carbon, graphene, or any suitable combination of these materials. The conductive gate fill layer material can further include dopants that are incorporated during or after formation (e.g., deposition). In various embodiments, the work function layer 150 can serve as a gate conductor without a conductive gate fill layer 160.

Figure 7:
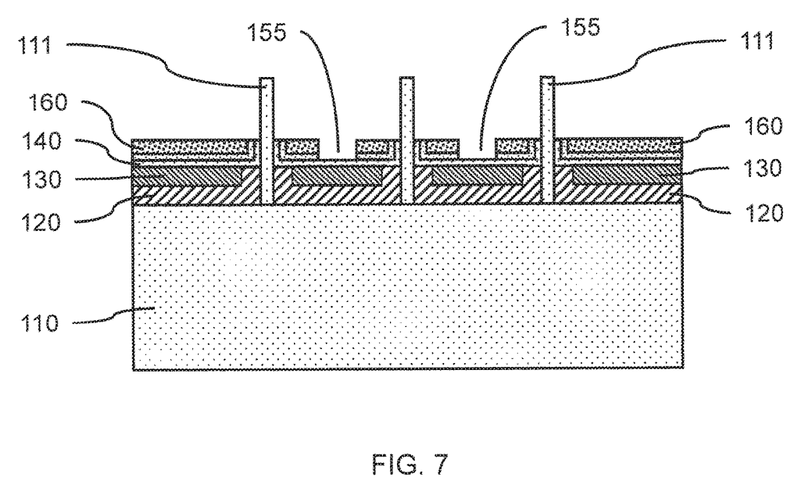
FIG. 7 is a cross-sectional side view showing exposed vertical dummy nanowires after removing the exposed portion of the gate dielectric layer, and patterned gate structures, in accordance with an embodiment of the present invention.

FIG. 7 is a cross-sectional side view showing exposed vertical dummy nanowires after removing the exposed portion of the gate dielectric layer, and patterned gate structures, in accordance with an embodiment of the present invention.

The exposed portion of the gate dielectric layer 140 can be removed using a selective isotropic etch to expose the upper portion of the vertical dummy nanowires 111.

In one or more embodiments, the conductive gate fill layer 160, work function layer 150 and gate dielectric layer 140 can be masked and etched to form a gate structure on the vertical dummy nanowires 111, where the height of the gate fill layer 160 and work function layer 150 can define a gate length on the vertical dummy nanowires 111. Removal of a portion of the gate fill layer 160 and work function layer 150 can form isolation trenches 155 that separate gate structures on different vertical dummy nanowires 111. Formation of isolation trenches 155 can expose portions of gate dielectric layer 140 or spacer layer 130.

Figure 8:
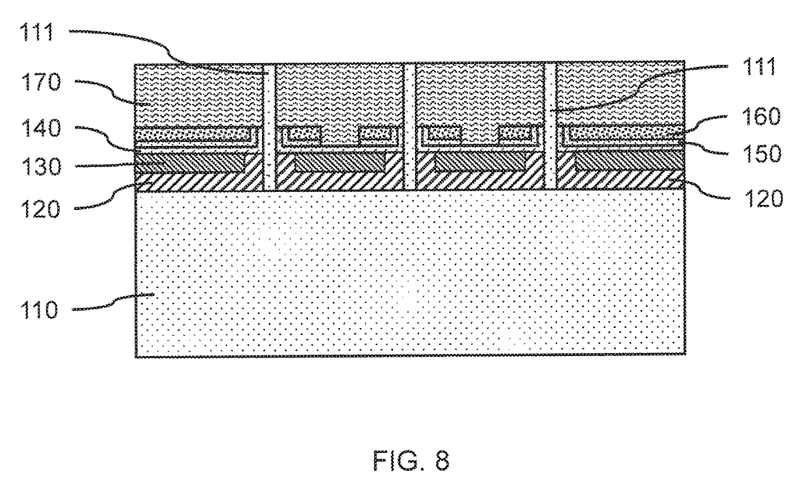
FIG. 8 is a cross-sectional side view showing an interlayer dielectric (ILD) layer formed on the gate structures and exposed vertical dummy nanowires, in accordance with an embodiment of the present invention.

FIG. 8 is a cross-sectional side view showing an interlayer dielectric (ILD) layer formed on the gate structures and exposed vertical dummy nanowires, in accordance with an embodiment of the present invention.

In one or more embodiments, an interlayer dielectric (ILD) layer 170 can be formed on the gate structures and exposed upper portions of the vertical dummy nanowires 111. A CMP can be used to reduce the height of the ILD layer 170 and provide a smooth, flat surface that exposes the top surfaces of the vertical dummy nanowires 111.

The ILD layer 170 can be formed of a dielectric material selected from the group consisting of silicon oxide (SiO), a low-K insulating dielectric, for example, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof.

Figure 9:
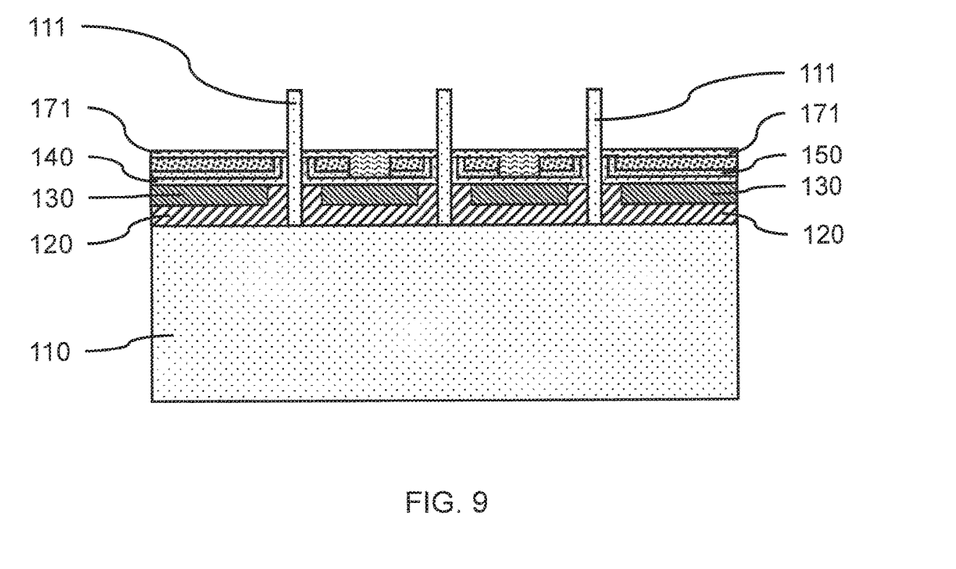
FIG. 9 is a cross-sectional side view showing an interlayer dielectric (ILD) layer with a reduced height, in accordance with an embodiment of the present invention.

FIG. 9 is a cross-sectional side view showing an interlayer dielectric (ILD) layer with a reduced height, in accordance with an embodiment of the present invention.

In one or more embodiments, the height of the ILD layer 170 can be reduced to expose an upper portion of the vertical dummy nanowires 111. The height of the ILD layer 170 can be reduced, for example, by RIE, a wet chemical etch, or a combination thereof.

In various embodiments, the thickness of the reduced height ILD layer 171 on the gate fill layer 160 and work function layer 150 can have a thickness in the range of about 3 nm to about 10 nm, or about 5 nm to about 8 nm, although other thicknesses are contemplated.

Figure 10:
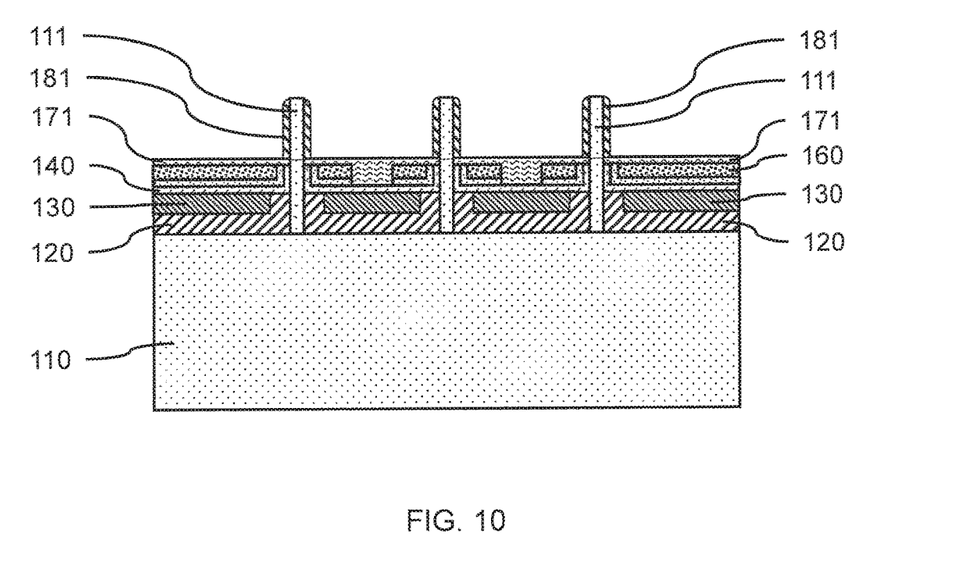
FIG. 10 is a cross-sectional side view showing dummy source/drain spacers on the exposed vertical dummy nanowires, in accordance with an embodiment of the present invention.

FIG. 10 is a cross-sectional side view showing dummy source/drain spacers on the exposed vertical dummy nanowires, in accordance with an embodiment of the present invention.

In one or more embodiments, dummy source/drain spacers 181 can be formed on the exposed vertical dummy nanowires 111. The dummy source/drain spacers 181 can be formed by depositing a dummy source/drain layer and removing the deposited material from the horizontal surfaces using a directional etch (e.g., RIE).

In one or more embodiments, the dummy source/drain spacers 181 can be formed of a dielectric insulating material that can be selectively etched relative to the surrounding materials. The dummy source/drain spacers 181 can be, for example, silicon oxide (SiO), silicon nitride (SiN), a silicon oxynitride (SiON), a silicon carbonitride (SiCN), a silicon boronitride (SiBN), a silicon borocarbide (SiBC), a silicon boro carbonitride (SiBCN), a boron carbide (BC), a boron nitride (BN), or combinations thereof. In various embodiments, dummy source/drain spacers 181 can be silicon nitride (SiN). Dummy source/drain spacers can be the same material as sacrificial cover layer.

In various embodiments, dummy source/drain spacers 181 can have a thickness on the sidewalls of the vertical dummy nanowires 111 in the range of about 5 nm to about 20 nm, or in the range of about 10 nm to about 15 nm, although other thicknesses are contemplated.

Figure 11:
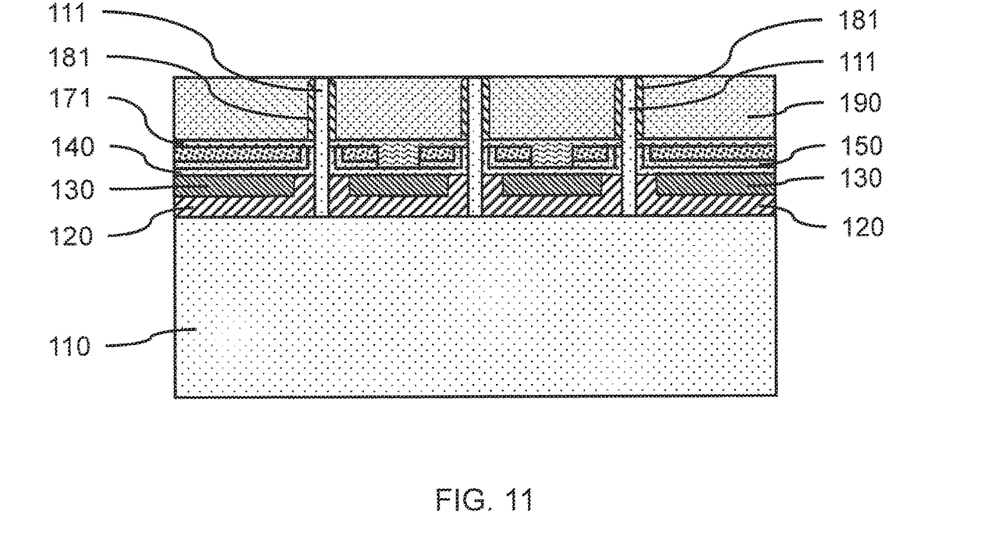
FIG. 11 is a cross-sectional side view showing a dielectric fill layer on the dummy source/drain spacers and ILD layer, in accordance with an embodiment of the present invention.

FIG. 11 is a cross-sectional side view showing a dielectric fill layer on the dummy source/drain spacers and ILD layer, in accordance with an embodiment of the present invention.

In one or more embodiments, a dielectric fill layer 190 can be formed on the dummy source/drain spacers 181 and reduced height ILD layer 171. A CMP can be used to reduce the height of the dielectric fill layer 190 and provide a smooth, flat surface that exposes the top surfaces of the vertical dummy nanowires 111.

The dielectric fill layer 190 can be a low-K insulating dielectric material, for example, silicon oxynitride (SiON), carbon doped silicon oxide (SiO:C), fluorine doped silicon oxide (SiO:F), boron carbon nitride (BCN), hydrogen silsesquioxane polymer (HSQ), methyl silsesquioxane polymer (MSQ), organosilicate glass (SiCOH), porous SiCOH, and combinations thereof.

Figure 12:
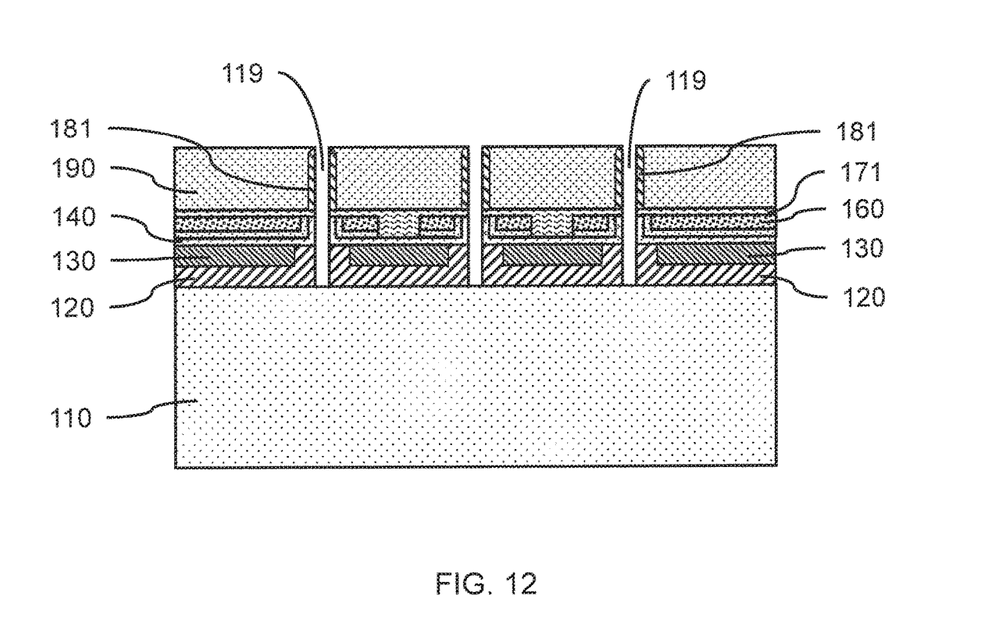
FIG. 12 is a cross-sectional side view showing nanowire trenches formed by removing the vertical dummy nanowires, in accordance with an embodiment of the present invention.

FIG. 12 is a cross-sectional side view showing nanowire trenches formed by removing the vertical dummy nanowires, in accordance with an embodiment of the present invention.

In one or more embodiments, nanowire trenches 119 can be formed by removing the vertical dummy nanowires 111, where the vertical dummy nanowires 111 can be removed by a selective isotropic etch (e.g., wet chemical etch). Removal of the vertical dummy nanowires 111 can expose the surface of the underlying substrate for epitaxial growth. The expose the surface of the underlying substrate 110 can have a {111} crystal face, where the substrate can be single crystal silicon (Si).

Figure 13:
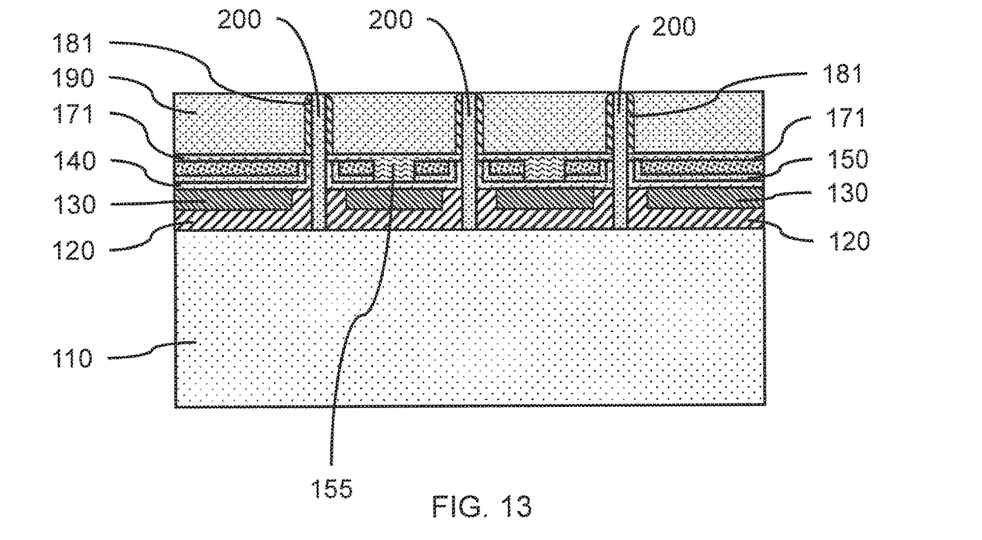
FIG. 13 is a cross-sectional side view showing replacement nanowires formed in the nanowire trenches, in accordance with an embodiment of the present invention.

FIG. 13 is a cross-sectional side view showing replacement nanowires formed in the nanowire trenches, in accordance with an embodiment of the present invention.

In one or more embodiments, replacement nanowires 200 can be formed in the nanowire trenches 119, where the replacement nanowires 200 can be epitaxially grown on the expose the surface of the underlying substrate 110. The replacement nanowires 200 can fill the nanowire trenches 119. The replacement nanowires 200 can be a different material from the substrate surface, where the replacement nanowires 200 are heteroepitaxially grown. The replacement nanowires 200 can have a lattice mismatch with the crystal face of the substrate 110, which can impart a strain. In various embodiments, the replacement nanowires 200 can be a heterostructure (i.e., where two adjoining semiconductor material layers are different chemical compositions, such that a heterojunction (i.e., an interface of unequal band gaps) is formed at the interface of the two semiconductor material layers) formed on the substrate 110, where the heterostructure nanowire (i.e., the nanowires 200 have a different chemical composition than the substrate 110, such that the crystal lattice of the nanowire is similar, but not identical, to the crystal lattice of the substrate, and where the nanowire can have a different bandgap than the substrate) forms a channel of a vertical gate transistor. In various embodiments, the nanowires 200 can be round, square, rectangular, or hexagonal. The nanowires 200 can have a width or diameter in the range of about 3 nm to about 50 nm, or in the range of about 5 nm to about 30 nm, or in the range of about 10 nm to 20 nm, although other widths and diameters are contemplated.

The replacement nanowires 200 can have a height in the range of about 200 nm to about 500 nm, or about 200 nm to about 350 nm, where the predetermined replacement nanowire height and lattice mismatch do not introduce dislocations (e.g., threading dislocations) at the substrate-nanowire interface due to lattice mismatch.

In one or more embodiments, the replacement nanowires 200 can be IV semiconductor material (e.g., Si), IV-IV semiconductor material (e.g., silicon-germanium SiGe), or III-V semiconductor material (e.g., GaAs, InAs, InGaAs, etc.). In various embodiments, the material of the replacement nanowires 200 can have a lattice mismatch with the underlying epitaxial growth surface of less than about 8%, or less than about 4%, or in the range of about 1% to about 3%. The lattice mismatch can be greater than 0, but less than the value for a critical height at which dislocations (e.g., threading dislocations) would appear for replacement nanowires 200 having a predetermined height.

Figure 14:
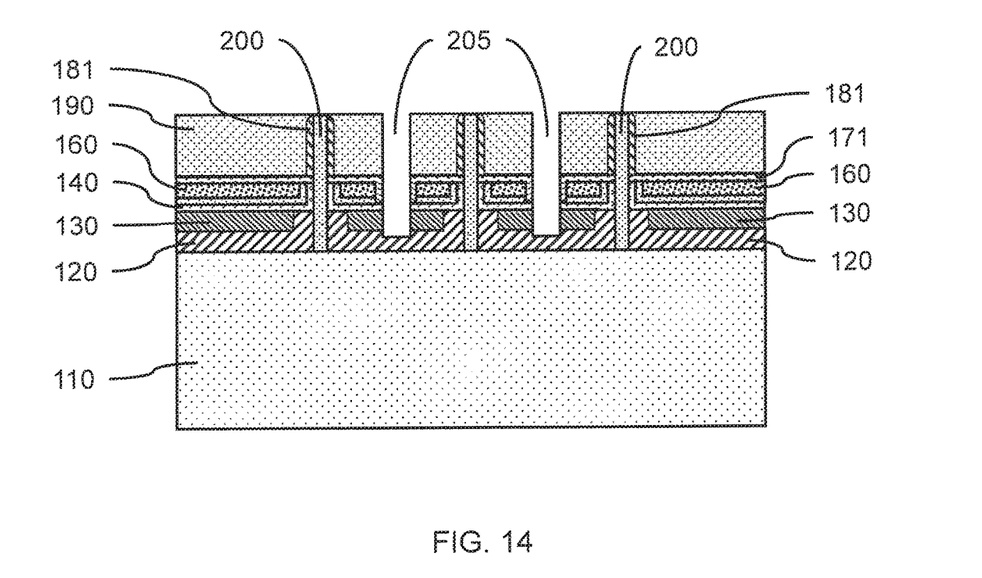
FIG. 14 is a cross-sectional side view showing access channels formed to the sacrificial cover layer between the gate structures, in accordance with an embodiment of the present invention.

FIG. 14 is a cross-sectional side view showing access channels formed to the sacrificial cover layer between the gate structures, in accordance with an embodiment of the present invention.

In one or more embodiments, access channels 205 can be formed to the sacrificial cover layer 120 between the gate structures. The dielectric fill layer 190 can be masked and patterned to form openings over the isolation trenches 155, where the width of the access channels 205 can be less than the width of the isolation trenches 155. In various embodiments, the access channels 205 can have a width in the range of about 20 nm to about 100 nm, or in the range of about 30 nm to about 75 nm, or about 50 nm, although other widths are also contemplated.

A portion of the reduced height ILD layer 171 can remain on the sidewalls of the gate fill layer 160 after formation of access channels 205. A directional etch (e.g., RIE) can be used to form access channels 205 through the dielectric fill layer 190, reduced height ILD layer 171, gate dielectric layer 140, and spacer layer 130 down to the sacrificial cover layer 120. The access channels 205 may not extend through the sacrificial cover layer 120 to the substrate 110.

Figure 15:
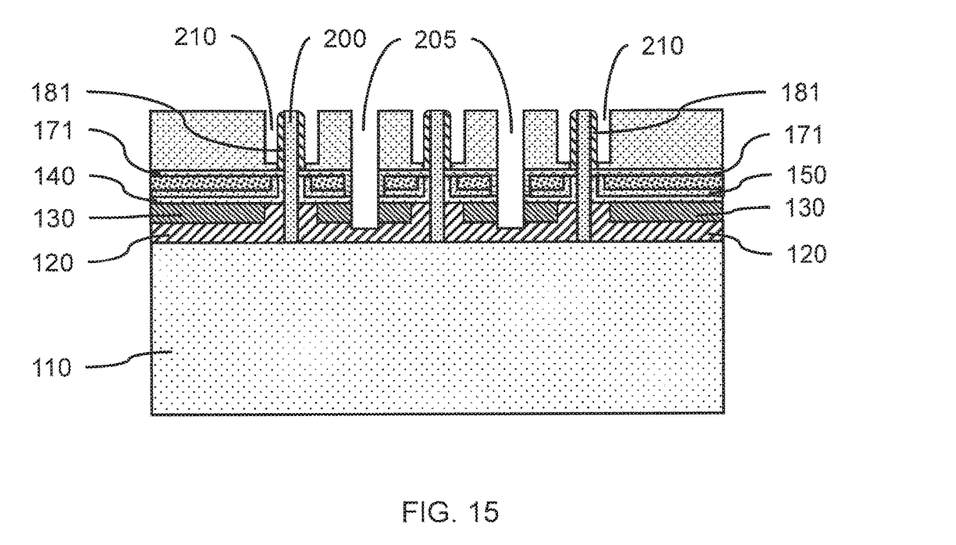
FIG. 15 is a cross-sectional side view showing access troughs formed in the dielectric fill layer to expose the dummy source/drain spacers, in accordance with an embodiment of the present invention.

FIG. 15 is a cross-sectional side view showing access troughs formed in the dielectric fill layer to expose the dummy source/drain spacers, in accordance with an embodiment of the present invention.

In one or more embodiments, access troughs 210 can be formed in dielectric fill layer 190 around the dummy source/drain spacers 181 and replacement nanowires 200. The access troughs 210 can extend to a depth less than the thickness of dielectric fill layer 190, where a thickness of the dielectric fill layer can remain on the reduced height ILD layer 171 adjacent to the replacement nanowire. The dummy source/drain spacers 181 on a replacement nanowire 200 can be exposed by the formation of an access trough.

Figure 16:
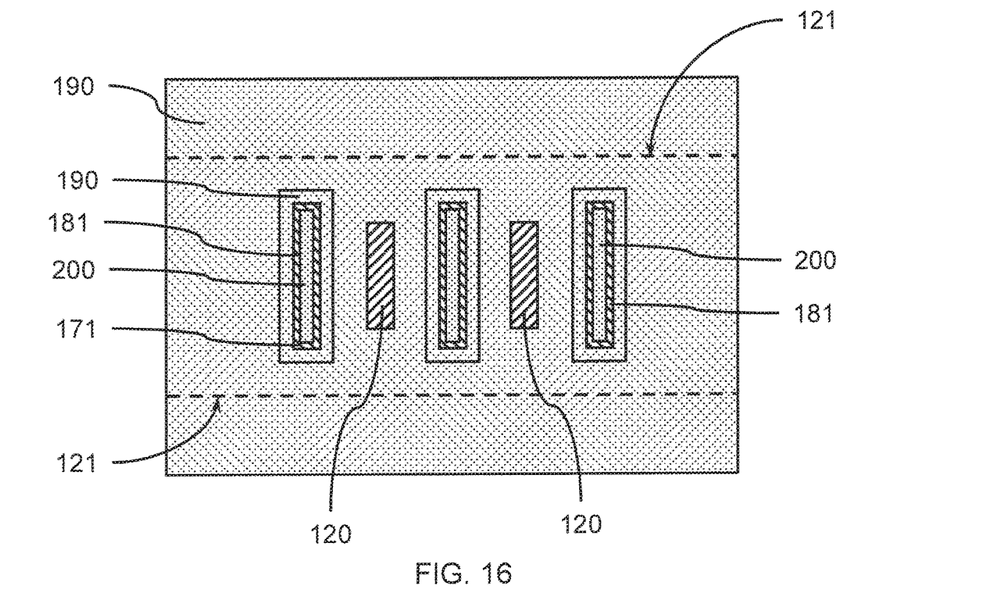
FIG. 16 is a top view showing the positioning of access troughs and access channels relative to the sacrificial cover layer and replacement nanowires, in accordance with an embodiment of the present invention.

FIG. 16 is a top view showing the positioning of access troughs and access channels relative to the sacrificial cover layer and replacement nanowires, in accordance with an embodiment of the present invention.

In one or more embodiments, the access troughs 210 and access channels 205 can be positioned above a region of the substrate 110 covered by the sacrificial cover layer 120 and including the replacement nanowires 200. Formation of the access troughs 210 and access channels 205 can expose portions of the sacrificial cover layer 120 and dummy source/drain spacers 181. The sacrificial cover layer 120 may extend to sacrificial cover layer boundaries 121, such that supporting material of the overlying layers is not completely removed when the sacrificial cover layer 120 is removed. The spacer layer 130 and/or gate dielectric layer 140 may extend beyond the sacrificial cover layer boundaries 121, and down to the substrate surface, where the spacer layer 130 and/or gate dielectric layer 140 can support the overlying layers.

Figure 17:
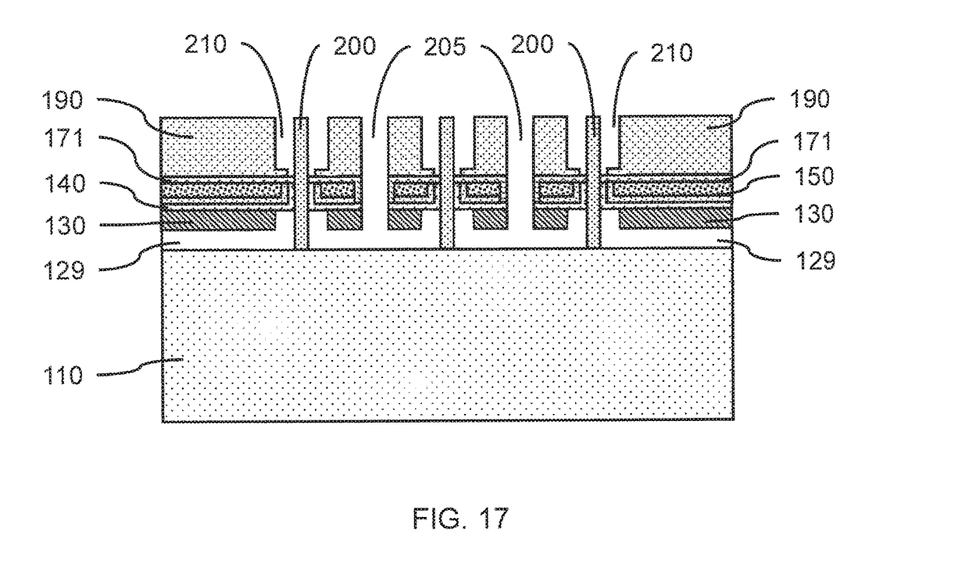
FIG. 17 is a cross-sectional side view showing exposed replacement nanowires after removal of the sacrificial cover layer and dummy source/drain spacers, in accordance with an embodiment of the present invention.

FIG. 17 is a cross-sectional side view showing exposed replacement nanowires after removal of the sacrificial cover layer and dummy source/drain spacers, in accordance with an embodiment of the present invention.

In one or more embodiments, the sacrificial cover layer 120 and dummy source/drain spacers 181 can be removed, for example, by a selective isotropic etch (e.g., wet chemical etch, plasma etch) that can propagate below the spacer layer 130 to form a void space 129. The dummy source/drain spacers 181 can be removed to expose the sidewalls of upper portions of the replacement nanowires 200 and portions of the reduced height ILD layer 171 adjacent to the replacement nanowire 200.

In various embodiments, the sacrificial cover layer 120 and dummy source/drain spacers 181 can be made of the same material to allow removal at the same time using the same etching process. The spacer layer 130 can be a different material from the sacrificial cover layer 120 to allow selective removal of the sacrificial cover layer 120, where the spacer layer 130 can act as an etch stop. The gate dielectric layer 140 can be a different material from the sacrificial cover layer 120 to allow selective removal of the sacrificial cover layer 120, where the gate dielectric layer 140 can act as an etch stop. The material of the replacement nanowires 200 can also be resistant to the etching process of the sacrificial cover layer 120 to maintain their dimensions.

The replacement nanowires 200 can act as support pillars for gate dielectric layer 140, work function layer 150, gate fill layer 160, and reduced height ILD layer 171.

Figure 18:
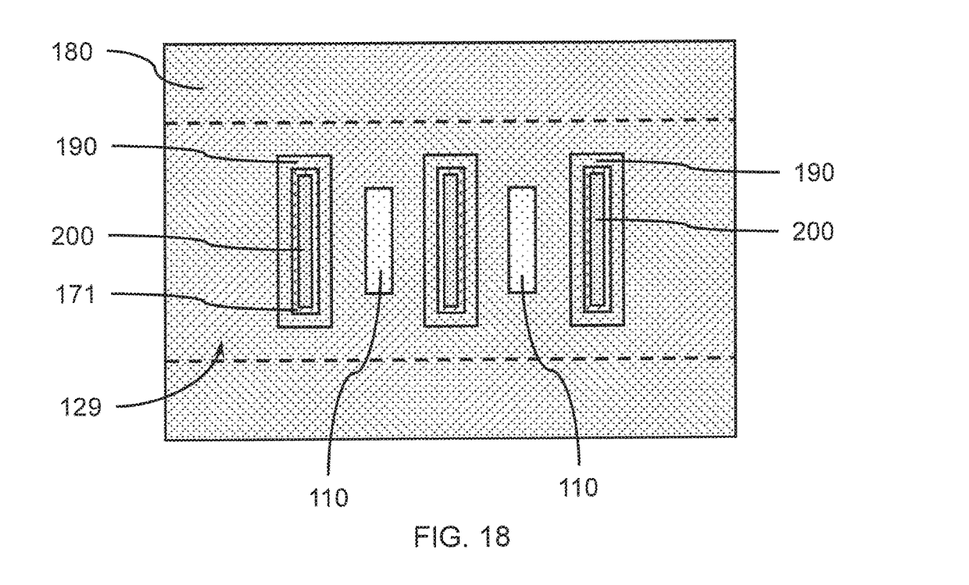
FIG. 18 is a top view showing the exposed replacement nanowires and substrate visible through the access troughs and access channels, in accordance with an embodiment of the present invention.

FIG. 18 is a top view showing the exposed replacement nanowires and substrate visible through the access troughs and access channels, in accordance with an embodiment of the present invention.

In one or more embodiments, the access channels 205 can expose portions of the spacer layer 130, replacement nanowires 200, and substrate 110. The access troughs 210 can expose portions of the reduced height ILD layer 171 and replacement nanowires.

Figure 19:
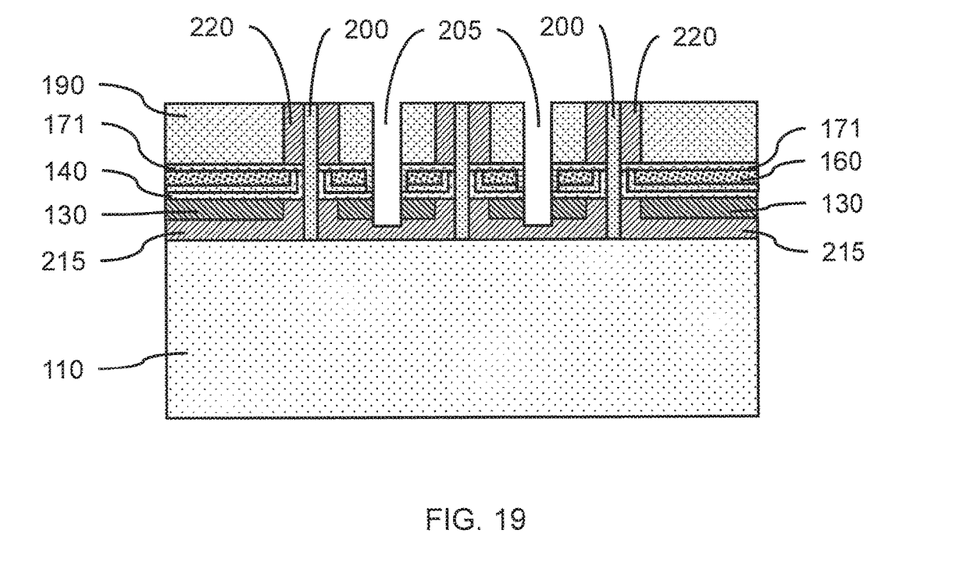
FIG. 19 is a cross-sectional side view showing the formation of source/drain regions in the void space formed by removal of the sacrificial cover layer and dummy source/drain spacers, in accordance with an embodiment of the present invention.

FIG. 19 is a cross-sectional side view showing the formation of source/drain regions in the void space formed by removal of the sacrificial cover layer and dummy source/drain spacers, in accordance with an embodiment of the present invention.

In one or more embodiments, bottom source/drain regions 215 can be formed in the void space 129 formed by removal of the sacrificial cover layer 120, and top source/drain regions 220 can be formed in the access troughs 210 enlarged by removal of the dummy source/drain spacers 181. The top source/drain regions 220 and bottom source/drain regions 215 can be formed on the exposed portions of the replacement nanowires 200, where the source/drain regions 215 can be formed by epitaxial growth off of the exposed surfaces of the replacement nanowires. The top and bottom source/drain regions 215, 220 can be formed by ALD, CVD, or a combination thereof, where the deposition/growth processes do not pinch off the void space 129 or plug the access channels 205 and/or access troughs 210, before the source/drain regions 215, 220 are formed.

In various embodiments, the bottom source/drain regions 215 and top source/drain regions 220 can be doped III-V semiconductor material. The bottom source/drain regions 215 and top source/drain regions 220 can be n+ doped indium-gallium-arsenide (InGaAs) or indium arsenide (InAs).

The top source/drain regions 220, bottom source/drain regions 215, gate structures, and replacement nanowires 200 can form one or more vertical gate transistors, where the current can flow vertically between the top source/drain region 220 and bottom source/drain region 215 past the gate structure.

Figure 20:
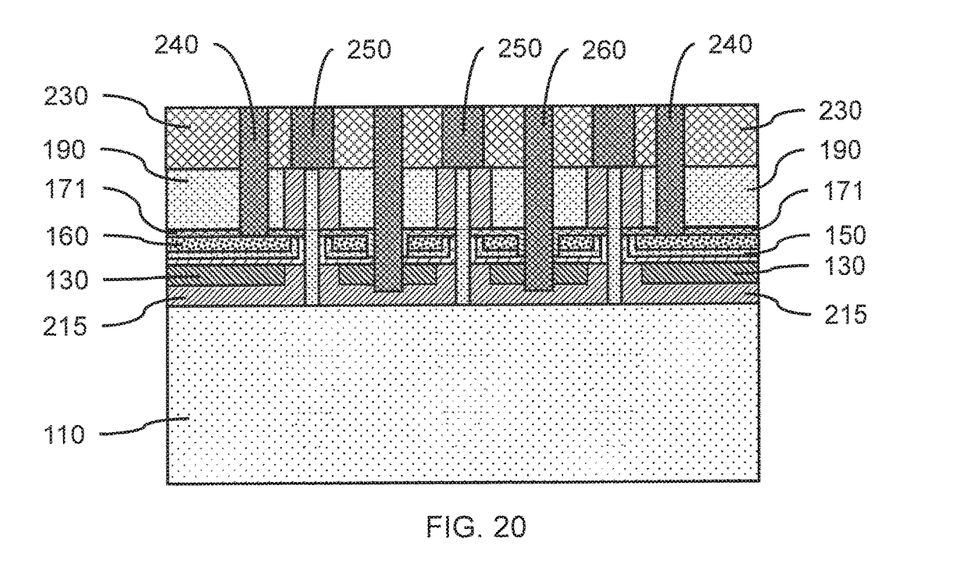
FIG. 20 is a cross-sectional side view showing the formation of electrical contacts to the source/drain regions and gate structures, in accordance with an embodiment of the present invention.

FIG. 20 is a cross-sectional side view showing the formation of electrical contacts to the source/drain regions and gate structures, in accordance with an embodiment of the present invention.

In one or more embodiments, gate electrical contacts 240 can be formed to gate fill layer 160 forming a gate structure on the replacement nanowires 200. A top source/drain electrical contact 250 can be formed to top source/drain region 220. A bottom source/drain electrical contact 260 can be formed to bottom source/drain region 215. The electrical contacts 240, 250, 260 can be a conductive material, including but not limited to tungsten, titanium, tantalum, ruthenium, zirconium, cobalt, tantalum nitride, titanium nitride, cobalt silicide, nickel silicide, carbon nanotubes, conductive carbon, graphene, or any suitable combination of these materials.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including." when used herein, specify the presence of stated features, integers, steps, operations, elements and/or components, but do not preclude the presence or addition of one or more other features, integers, steps, operations, elements, components and/or groups thereof.

Spatially relative terms, such as "beneath." "below." "lower," "above," "upper." and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of fabrication and a nanowire vertical gate device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanowire heterostructure, comprising:
    forming a dummy nanowire on a substrate;
    forming a sacrificial cover layer on the dummy nanowire;
    forming a spacer layer on a portion of the sacrificial cover layer, wherein a portion of the sacrificial cover layer extends above the top surface of the spacer layer;
    removing the portion of the sacrificial cover layer that extends above the top surface of the spacer layer;
    forming a gate structure on the spacer layer and a remaining portion of the sacrificial cover layer;
    forming an interlayer dielectric (ILD) layer on the gate structure;
    removing the dummy nanowire to form a nanowire trench; and
    forming a replacement nanowire in the nanowire trench.

2. The method of claim 1, further comprising forming an access channel through the ILD layer and spacer layer to the remaining portion of the sacrificial cover layer; and
    removing the remaining portion of the sacrificial cover layer to form a void space.

3. The method of claim 2, further comprising forming a bottom source/drain region in the void space.

4. The method of claim 3, wherein the bottom source/drain region is formed by epitaxial growth on the replacement nanowire.

5. The method of claim 1, wherein the replacement nanowire is epitaxially grown on the substrate.

6. The method of claim 5, wherein the replacement nanowire is a III-V semiconductor material.

7. The method of claim 6, wherein the replacement nanowire is gallium-arsenide (GaAs) or indium-gallium-arsenide (InGaAs).

8. The method of claim 1, further comprising forming a dummy source/drain spacer on the dummy nanowire before forming the ILD layer, and forming an access trough around the dummy source/drain spacer.

9. The method of claim 8, further comprising removing the dummy source/drain spacer, and forming a top source/drain region in the access trough.

10. The method of claim 9, wherein the top source/drain region is formed by epitaxial growth on the replacement nanowire.

11. A method of forming a nanowire heterostructure, comprising:
    forming a dummy nanowire on a substrate;
    forming a sacrificial cover layer on the dummy nanowire;
    forming a spacer layer on a portion of the sacrificial cover layer, wherein a portion of the sacrificial cover layer extends above the top surface of the spacer layer;
    removing the portion of the sacrificial cover layer that extends above the top surface of the spacer layer;
    forming a gate structure on the spacer layer and a remaining portion of the sacrificial cover layer;
    forming a dummy source/drain spacer on the dummy nanowire;
    forming an interlayer dielectric (ILD) layer on the gate structure and dummy source/drain spacer;

removing the dummy nanowire to form a nanowire trench;

forming a replacement nanowire in the nanowire trench; and forming an access channel through the ILD layer and the spacer layer to the remaining portion of the sacrificial cover layer.

12. The method of claim 11, further comprising forming an access trough around the dummy source/drain spacer, and removing the dummy source/drain spacer and remaining portion of the sacrificial cover layer to form a void space using an isotropic etch.

13. The method of claim 12, further comprising forming a top source/drain region in the access trough and a bottom source/drain region in the void space by epitaxial growth on the replacement nanowire.

14. The method of claim 13, wherein the replacement nanowire is gallium-arsenide (GaAs) or indium-gallium-arsenide (InGaAs).

15. The method of claim 14, wherein the replacement nanowire has a width or diameter in a range of about 3 nm to about 50 nm.

16. A vertical transport field effect transistor, comprising:
a replacement nanowire on a substrate, wherein the replacement nanowire is a III-V semiconductor material;
a bottom source/drain region on the replacement nanowire and the substrate;
a boron nitride (BN) spacer layer on a portion of the bottom source/drain region, a gate structure on the boron nitride (BN) spacer layer and the bottom source/drain region;
an interlayer dielectric (ILD) layer on the gate structure; and
a top source/drain region on the interlayer dielectric (ILD) layer and the replacement nanowire.

17. The vertical transport field effect transistor of claim 16, further comprising a bottom source/drain electrical contact that passes through the boron nitride (BN) spacer layer to the bottom source/drain region.

18. The vertical transport field effect transistor of claim 17, wherein the top source/drain region and the bottom source/drain region are n+ doped III-V semiconductor material.

19. The vertical transport field effect transistor of claim 18, wherein the bottom source/drain region has a thickness in a range of about 10 nm to about 50 nm, and the boron nitride (BN) spacer layer has a thickness in a range of about 10 nm to about 50 nm.

20. The vertical transport field effect transistor of claim 19, wherein the replacement nanowire has a height in the range of about 200 nm to about 500 nm.

* * * * *